(12) United States Patent
Okamoto

(10) Patent No.: US 7,171,643 B2
(45) Date of Patent: Jan. 30, 2007

(54) SYSTEM LSI DESIGN SUPPORT APPARATUS AND A SYSTEM LSI DESIGN SUPPORT METHOD

(75) Inventor: Minoru Okamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 404 days.

(21) Appl. No.: 10/787,166

(22) Filed: Feb. 27, 2004

(65) Prior Publication Data

US 2004/0261051 A1  Dec. 23, 2004

(30) Foreign Application Priority Data

Feb. 27, 2003  (JP) ............ P. 2003-051046

(51) Int. Cl.
*G06F 17/50* (2006.01)
*G06F 9/45* (2006.01)

(52) U.S. Cl. ............... 716/18; 716/4; 716/7; 716/1

(58) Field of Classification Search ............ 716/4, 716/7, 18, 1; 700/97; 712/229; 717/114, 717/136, 156
See application file for complete search history.

(56) References Cited

U.S. PATENT DOCUMENTS

| 5,371,895 | A * | 12/1994 | Bristol .............. 717/136 |
| 6,064,819 | A * | 5/2000 | Franssen et al. .......... 717/156 |
| 6,199,201 | B1 * | 3/2001 | Lamping et al. .......... 717/114 |
| 6,397,341 | B1 * | 5/2002 | Genevriere ............ 713/400 |
| 6,609,229 | B1 * | 8/2003 | Ly et al. .............. 716/4 |
| 2003/0033039 | A1 * | 2/2003 | Gutberlet et al. .......... 700/97 |
| 2003/0088840 | A1 * | 5/2003 | Yonezawa et al. .......... 716/7 |
| 2003/0200425 | A1 * | 10/2003 | Swoboda et al. .......... 712/229 |
| 2005/0102647 | A1 * | 5/2005 | Tsuchiya ............ 716/18 |

FOREIGN PATENT DOCUMENTS

JP  9-160949  6/1997

OTHER PUBLICATIONS

Kim, Tae-Woo., et al. "Hardware Cost Estimation Techniques for C-Level Description." VLSI and CAD, 1999, ICVC, 6th International Conference of Seoul, South Korea, Oct. 26-27, IEEE US, XP010370108, pp. 85-88.
Carro, Luigi., et al. "System Synthesis for Multiprocessor Embedded Applications." Design, Automation and Test in Europe, Mar. 27, 2000, XP010377540, pp. 697-702.
Sciuto, Donatella., et al. "Metrics for Design Space Exploration of Heterogeneous Multiprocessor Embedded Systems." Proceedings of the 10th International Symposium on Hardware/Software Codesign. Codes, 2002 (IEEE Cat. No. 02TH8627) ACM, New York, NY, May 8, 2002, XP002317354, pp. 55-60.

* cited by examiner

*Primary Examiner*—Jack Chiang
*Assistant Examiner*—Magid Y. Dimyan
(74) *Attorney, Agent, or Firm*—McDermott Will & Emery LLP

(57) ABSTRACT

Adequately assigning features provided by the system to processing units having different architectures incorporated in a system LSI. An analysis unit is provided for counting the number of conditional branch statements and the number of loop control statements, the number of nestings of the conditional branch statements and the number of nestings of the loop control statements, and the number of functions required to generate the conditions of the conditional branch statements and the number of repetitions of loop control statements described in each function of a program describing system features in a high-level language.

27 Claims, 20 Drawing Sheets

FIG. 2

```
        int       func_A    (AIN1,AIN2)
                  int       AIN1,AIN2;
                  {
                  int       A1, A2;
                  int       AO1;
         211 ─── if (AIN1 == 10)         {
                    212 ── if (AIN2 > 20)             {
                              ...
                           }
                  } else {
                     ...
         213 ─── }
                  if (AIN1 > 10)           {
                     ...
                  }
                  return (AO1);
                  } int       func_B    (BIN1)
                  int       BIN1;
                  {
                  int       B1, B2;
                  int       BO1;
                  if (BIN1 > 20)           {
                     ...
                  }
                  if (BIN1 > 18 )          {
                     ...
                  }
                  if (BIN1 > 16)           {
                     ...
                  }
                  ...
                  if (BIN1 > 2) {
                     ...
                  }
                  } void      func_C     ()
                  {
                     ...
                  }
```

132

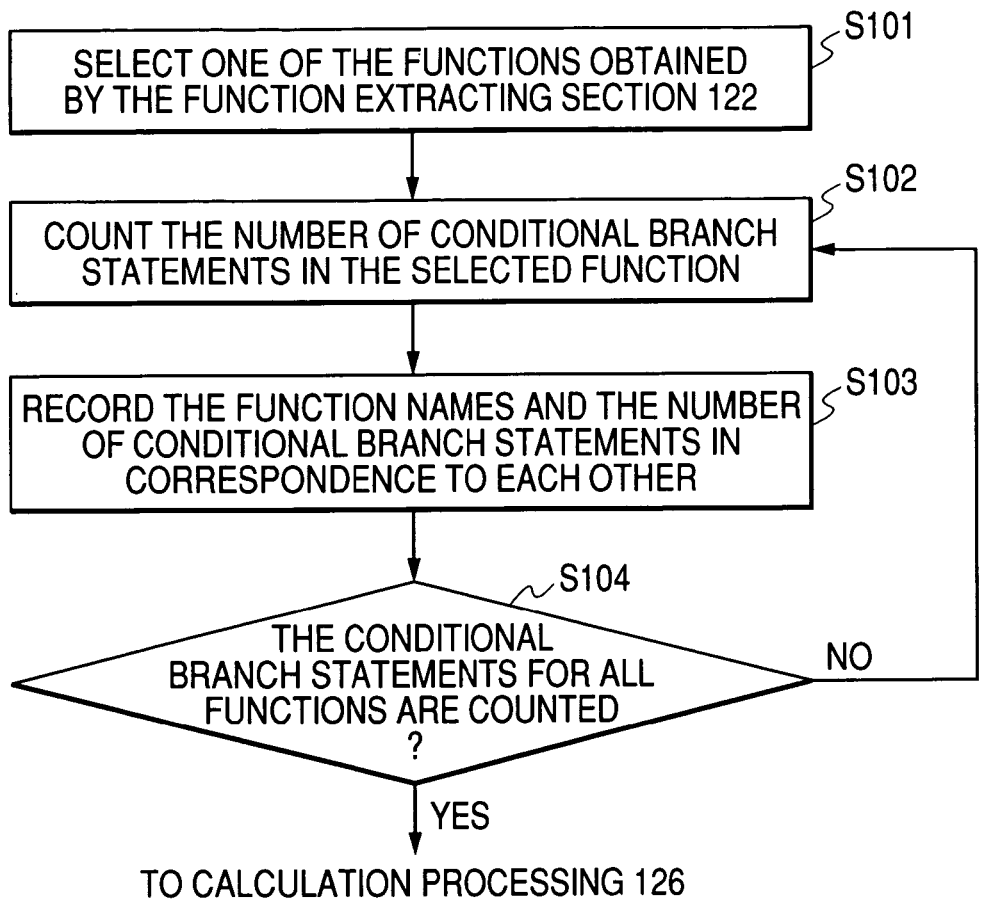

FIG. 6

| FUNCTION NAME | CONDITIONAL BRANCH STATEMENT | | |
|---|---|---|---|
| | NUMBER | NUMBER OF NESTINGS | |
| | | NUMBER OF NESTING STAGE | NUMBER OF CORRESPONDING CONDITIONAL BRANCH STATEMENTS |
| func_A | 3 | 0 | 2 |
| | | 1 | 1 |
| func_B | 10 | 0 | 10 |
| func_C | 0 | 0 | 0 |

FIG. 7

```
132        func_A      (AIN1,AIN2)
           int         AIN1,AIN2;
           {
           int         A1, A2;
       211 int         AO1;
          ⌐if (AIN1 == 10)           {
                   ⌐if (AIN2 > 20)             {
               212      ...
                       }
           } else {
               ...
       213 }
          ⌐if (AIN1 > 10)            {
               ...
           }
           return (AO1);
           }
    void   func_D      ()
           {
       711 int         D1, D2, D3;
          ⌐D2 = func_A1 ( D1 );
           ⌐AIN1 = func_A2 ( D2 );
       712  ...
           D3 = func_A ( AIN1, D2 );
           }
```

FIG. 10

```
int         func_LA    (AIN1,AIN2)
            int        AIN1,AIN2;
            {
            int        i,j;
            int        A1, A2;
            int        AO1;
            for (i = 0; i < AIN1; ++i)  {
                for (j = 0; j < AIN2; ++j )  {
                    ...
                }
                ...
            }
            for (i = 0; i < 10; ++i)    {
                ...
            }
            return (AO1);
            } int         func_LB    (BIN1)
            int        BIN1;
            {
            int        i;
            int        B1, B2;
            int        BO1;
            for (i = 0; i < BIN1; ++i)  {
                ...
            }
            for (i = 0; i < BIN1; ++i)  {
                ...
            }
            for (i = 0; i < BIN1; ++i)  {
                ...
            }
            ...
            for (i = 0; i < BIN1; ++i)  {
                ...
            }
            } void        func_LC    ()
            {
            ...
            }
```

Labels: 132, 1011, 1012, 1013

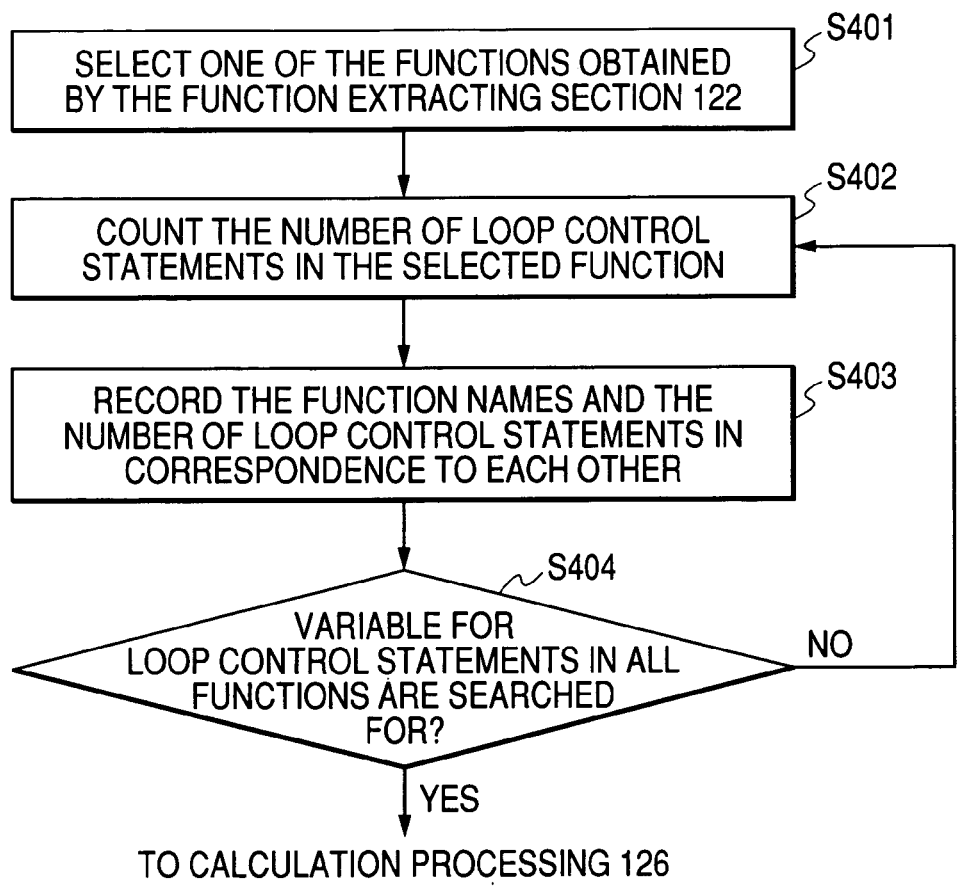

FIG. 14

| FUNCTION NAME | LOOP CONTROL STATEMENT | | |
|---|---|---|---|
| | NUMBER | NUMBER OF NESTINGS | |
| | | NUMBER OF NESTING STAGE | NUMBER OF CORRESPONDING LOOP CONTROL STATEMENTS |
| func_LA | 3 | 0 | 2 |
| | | 1 | 1 |
| func_LB | 10 | 0 | 10 |
| func_LC | 0 | 0 | 0 |

FIG. 15

```
int       func_LA    (AIN1,AIN2)
          int        AIN1,AIN2;
          {
          int        A1, A2;
    1011⌐ int        AO1;
         ⌐for (i = 0; i < AIN1; ++i)   {
              1012⌐ for (j = 0; j < AIN2; ++j )   {
                    ...
                    }
              ...
              }
    1013⌐ for (i = 0; i < 10; ++i)   {
         ⌐ ...
           }
           return (AO1);
           } void      func_LD    ()
          {
    1511⌐ int        D1, D2, D3;
         ⌐ D2 = func_LA1 ( D1 );
         ⌐ AIN1 = func_LA2 ( D2 );
    1512⌐ ...
           D3 = funcL_A ( AIN1, D2 );
           }
```

| FUNCTION NAME | CONDITIONAL BRANCH STATEMENT | | | | | | LOOP CONTROL STATEMENT | | | | |
|---|---|---|---|---|---|---|---|---|---|---|---|
| | NUMBER | NUMBER OF NESTINGS | | VARIABLE GENERATION | | NUMBER | NUMBER OF NESTINGS | | GENERATION OF VARIABLES FOR THE NUMBER OF REPETITIONS | | |
| | | NUMBER OF NESTING STAGES | NUMBER OF CORRESPONDING CONDITIONAL BRANCH STATEMENTS | NUMBER OF FUNCTIONS REQUIRED FOR GENERATION | NUMBER OF VARIABLES | | NUMBER OF NESTING STAGES | NUMBER OF CORRESPONDING LOOP CONTROL STATEMENTS | NUMBER OF FUNCTIONS REQUIRED FOR GENERATION | NUMBER OF VARIABLES |
| func_A | 3 | 0 | 2 | 2 | 1 | 0 | 0 | 0 | 0 | 0 |
| | | 1 | 1 | 0 | 1 | | | | | |
| func_B | 10 | 0 | 10 | 0 | 1 | 0 | 0 | 0 | 0 | 0 |
| func_C | 0 | 0 | 0 | 0 | 0 | 0 | 0 | 0 | 0 | 0 |
| func_D | 0 | 0 | 0 | 0 | 0 | 0 | 0 | 0 | 0 | 0 |
| func_LA | 0 | 0 | 0 | 0 | 0 | 3 | 1 | 2 | 2 | 1 |
| func_LB | 0 | 0 | 0 | 0 | 0 | 10 | 0 | 1 | 0 | 1 |
| func_LC | 0 | 0 | 0 | 0 | 0 | 0 | 0 | 10 | 0 | 1 |
| func_LD | 0 | 0 | 0 | 0 | 0 | 0 | 0 | 0 | 0 | 0 |

FIG. 21

| FUNCTION NAME | CONDITIONAL BRANCH STATEMENT | | |
|---|---|---|---|
| | NUMBER | VARIABLE GENERATION | |
| | | NUMBER OF FUNCTIONS REQUIRED FOR GENERATION | NUMBER OF VARIABLES |
| func_A+func_D | 3 | 2 | 1 |
| | | 0 | 1 |

FIG. 22

| FUNCTION NAME | LOOP CONTROL STATEMENT | | |
|---|---|---|---|
| | NUMBER | GENERATION OF VARIABLES FOR THE NUMBER OF REPETITIONS | |
| | | NUMBER OF FUNCTIONS REQUIRED FOR GENERATION | NUMBER OF VARIABLES |
| func_LA+func_LD | 3 | 2 | 1 |
| | | 0 | 1 |

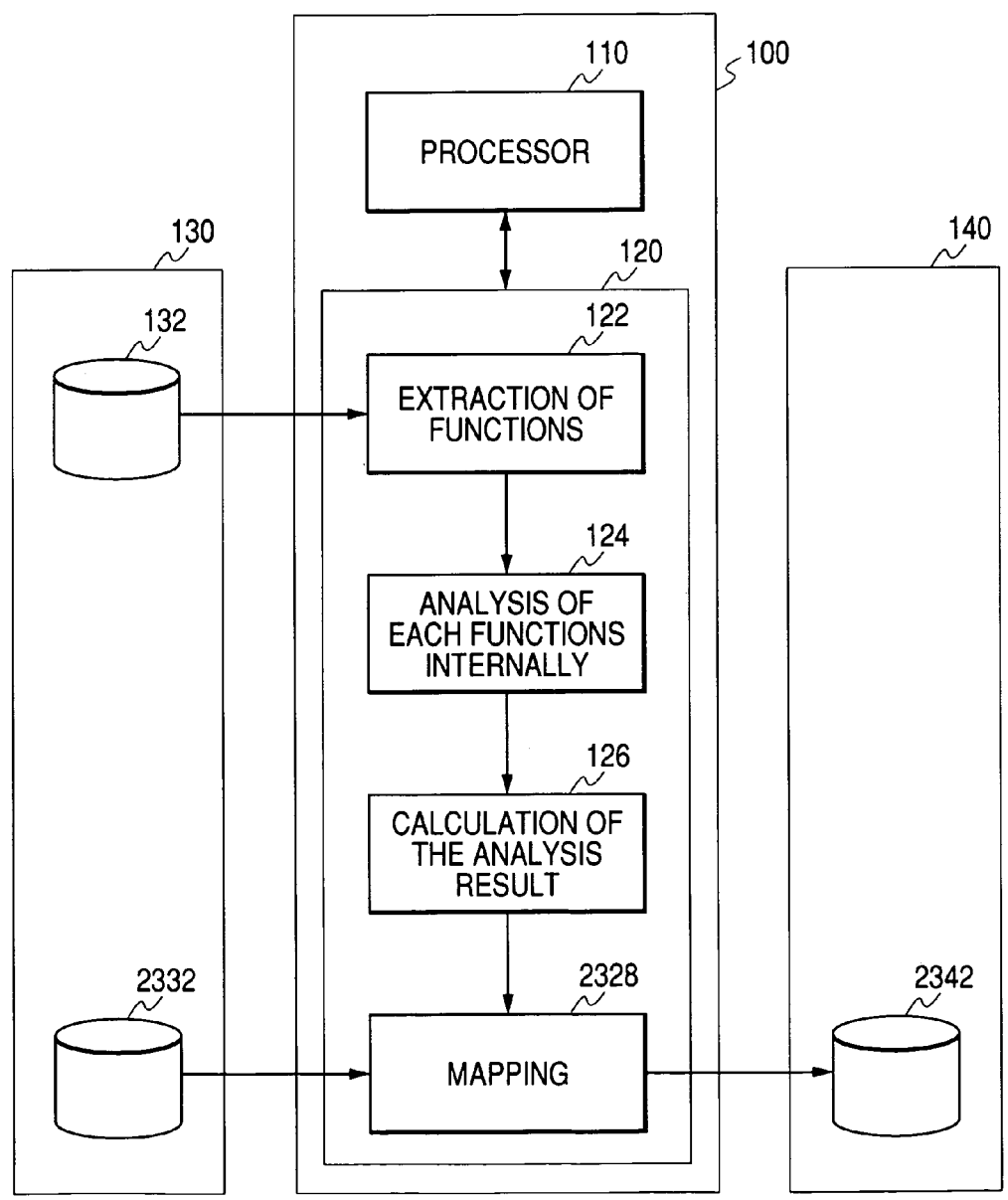

FIG. 24

| PROCESSING UNIT | PREFERABLE NUMBER OF CONDITIONAL BRANCH STATEMENTS |
|---|---|
| CPU | 10 OR MORE |
| DSP | 3 TO 9 |
| DEDICATED LOGIC | 2 OR LESS |

FIG. 25

| FUNCTION NAME | APPROPRIATE PROCESSING UNIT |
|---|---|
| func_A | DSP |
| func_B | CPU |
| func_C | DEDICATED LOGIC |

FIG. 26

| PROCESSING UNIT | PREFERABLE NUMBER OF LOOP CONTROL STATEMENTS |
|---|---|
| CPU | 3 TO 9 |
| DSP | 10 OR MORE |
| DEDICATED LOGIC | 2 OR LESS |

FIG. 27

| FUNCTION NAME | APPROPRIATE PROCESSING UNIT |
|---|---|
| func_LA | CPU |
| func_LB | DSP |
| func_LC | DEDICATED LOGIC |

FIG. 28

| FUNCTION NAME | NUMBER | APPROPRIATE CONDITIONAL BRANCH STATEMENT | | | | APPROPRIATE LOOP CONTROL STATEMENT | | | | |
|---|---|---|---|---|---|---|---|---|---|---|
| | | NUMBER OF NESTINGS | | VARIABLE GENERATION | | NUMBER | NUMBER OF NESTINGS | | GENERATION OF VARIABLES FOR THE NUMBER OF REPETITIONS | |
| | | NUMBER OF NESTING STAGES | NUMBER OF CORRESPONDING CONDITIONAL BRANCH STATEMENTS | NUMBER OF CORRESPONDING CONDITIONAL BRANCH STATEMENTS | NUMBER OF VARIABLES | | NUMBER OF NESTING STAGES | NUMBER OF CORRESPONDING LOOP CONTROL STATEMENTS | NUMBER OF FUNCTIONS REQUIRED FOR GENERATION | NUMBER OF VARIABLES |
| CPU | 10 OR MORE | 0 | 1 OR MORE | 0 | 1 OR MORE | | | | | |
| | | 1 | 1 OR MORE | 1 | 1 OR MORE | | | | | |
| | | 2 OR MORE | 1 OR MORE | 2 OR MORE | 1 OR MORE | | | | | |
| DSP | 3 TO 9 | 0 | 3 TO 9 | 0 | 3 TO 9 | 3 TO 9 | 0 | 3 TO 9 | 0 | 3 TO 9 |
| | | 1 | 3 OR LESS | 1 | 3 OR LESS | 10 OR MORE | 1 | 0 | 1 | 0 |
| | | 2 OR MORE | 1 OR LESS | 2 OR MORE | 1 OR LESS | | 2 OR MORE | 0 | 2 OR MORE | 0 |
| DEDICATED LOGIC | 2 OR LESS | 0 | 3 OR LESS | 0 | 3 OR LESS | 3 OR LESS | 0 | 1 OR MORE | 0 | 2 OR LESS |
| | | | | | | | 1 | 1 OR MORE | 1 | 2 OR LESS |
| | | | | | | | 2 OR MORE | 1 OR MORE | 2 OR MORE | 2 OR LESS |
| | | | | | | | 0 | 3 OR LESS | 0 | 3 OR LESS |

FIG. 29

| FUNCTION NAME | APPROPRIATE CONDITIONAL BRANCH STATEMENT | | | | | APPROPRIATE LOOP CONTROL STATEMENT | | | | |
|---|---|---|---|---|---|---|---|---|---|---|
| | NUMBER | NUMBER OF NESTINGS | | VARIABLE GENERATION | | NUMBER | NUMBER OF NESTINGS | | GENERATION OF VARIABLES FOR THE NUMBER OF REPETITIONS | |
| | | NUMBER OF NESTING STAGES | NUMBER OF CORRESPONDING CONDITIONAL BRANCH STATEMENTS | NUMBER OF FUNCTIONS REQUIRED FOR GENERATION | NUMBER OF VARIABLES | | NUMBER OF NESTING STAGES | NUMBER OF CORRESPONDING LOOP CONTROL STATEMENTS | NUMBER OF FUNCTIONS REQUIRED FOR GENERATION | NUMBER OF VARIABLES |
| CPU | 10 OR MORE (K=8) | 0 (K=1) | (1 OR MORE) | 0 (K=1) | (1 OR MORE) | 3 TO 9 (K=6) | 0 (K=1) | 3 TO 9 | 0 (K=1) | 3 TO 9 |
| | | 1 (K=2) | 1 OR MORE | 1 (K=2) | 1 OR MORE | | 1 (K=1) | (0) | 1 (K=1) | (0) |
| | | 2 OR MORE (K=3) | 1 OR MORE | 2 OR MORE (K=3) | (1 OR MORE) | | 2 OR MORE (K=1) | (0) | 2 OR MORE (K=1) | (0) |
| DSP | 3 TO 9 (K=8) | 0 (K=1) | 3 TO 9 | 0 (K=1) | 3 TO 9 | 10 OR MORE (K=6) | 0 (K=1) | 1 OR MORE | 0 (K=1) | (2 OR LESS) |
| | | 1 (K=2) | (3 OR LESS) | 1 (K=2) | (3 OR LESS) | | 1 (K=2) | 1 OR MORE | 1 (K=2) | (2 OR LESS) |
| | | 2 OR MORE (K=2) | (1 OR LESS) | 2 OR MORE (K=2) | (1 OR MORE) | | 2 OR MORE (K=3) | 1 OR MORE | 2 OR MORE (K=3) | (2 OR LESS) |
| DEDICATED LOGIC | K=6 | 0 (K=1) | (3 OR LESS) | 0 (K=1) | 3 OR LESS | 3 OR LESS (K=6) | 0 (K=1) | (3 OR LESS) | 0 (K=2) | (3 OR LESS) |

CPU = 3+4+2+2=11
DSP = 6+4+4+6=20
DEDICATED LOGIC = 1+1+6+2+2=12

FIG. 30

| FUNCTION NAME | APPROPRIATE PROCESSING UNIT |
|---|---|
| func_A | DSP |
| func_B | CPU |
| func_C | DEDICATED LOGIC |
| func_LA | CPU |
| func_LB | DSP |
| func_LC | DEDICATED LOGIC |

SYSTEM LSI DESIGN SUPPORT APPARATUS AND A SYSTEM LSI DESIGN SUPPORT METHOD

BACKGROUND OF THE INVENTION

1. Field of the Invention

The present invention relates to system LSI design support apparatus and a system LSI design support method which support assignment of the features implemented by system programs described in a high-level language to system LSIs comprising a microprocessor, a digital signal processor, and a dedicated logic circuit.

2. Description of the Related Art

Recently, it has been made possible to mount a system comprising multiple features on a single chip LSI in line with the increase in the packing density of LSI. The LSI (hereinafter referred to as a system LSI) comprises different types of processing units including a microprocessor, a digital signal processor and a dedicated logic circuit as well as a memory. Various system features are executed by appropriate processing units.

Each processing unit has a separate architecture and is tailored to execute particular processing. For example, a microprocessor (hereinafter referred to as a CPU) is tailored to determine various control information input from outside an LSI or execute processing having a complicated algorithm on a program described in a high-level language.

A digital signal processor (hereinafter referred to as a DSP) is tailored to execute a complicated arithmetic operation at high speed. A dedicated logic circuit is capable of executing a simple arithmetic operation at a high efficiency but is not fit for processing accompanied by complicated judgment conditions.

Which processing units system features are assigned to is determined by the following procedure. First, simple analysis is made based on a program describing part or whole of the system operation. In this analysis, processing time per program feature unit, that is module, or function in a high-level language such as the C language. Based on this information, the designer assigns system features to appropriate processing units. Next, the designer calculates detailed processing time and number of execution cycles per processing unit. In case there have been detected any problems up to this stage, the designer creates built-in programs in accordance with the processing units, for example programs executed by the CPU or those for the DSP as well as designs a dedicated logic circuit to calculates correct processing time.

A design support method has been proposed to support the aforementioned series of processes (refer to for example the Japanese Patent Laid-Open No. 160949/1997, pages 4–14, FIG. 1). According to the Japanese Patent Laid-Open No. 160949/1997, an object code obtained by compiling a program described in a high-level language comprising a plurality of functions is input to execute a simulation and record/output the processing time and processing count for a prespecified section thereby selecting a section to be implemented in hardware, or processed using a dedicated logic, depending on the length of the processing time.

While the related art method supports assignment of a particular system feature to a dedicated logic based on the processing time, the method has no information determined in accordance with other standards. In other words, in case the processing time is satisfied by the CPU in implementing Feature which mainly uses simple arithmetic operation in some system features, there is no need to perform processing by way of a dedicated logic. In such a case, the CPU actually executes processing which is not suitable for its architecture. This results in large amounts of unnecessary operations thus inviting an increase in the power consumption.

Another example is: in case the CPU cannot implement Function B having a complicated algorithm using multiple conditional judgments in some system features within a predetermined time, Feature B is assigned to a dedicated logic. The problem is that a multistage state transition control circuit is required to implement such complicated processing by using a dedicated logic. This scales up the dedicated logic circuit and the corresponding design period will be enormous.

SUMMARY OF THE INVENTION

The invention has been accomplished in view of the above circumstances and aims at providing system LSI design support apparatus and a system LSI design support method which support appropriate assignment of features provided by the system to processing units having different architectures incorporated in a system LSI.

In order to solve the problems, the first aspect of the invention provides system LSI design support apparatus which supports a design for assigning system features to a system LSI comprising processing units having a plurality of different architectures, the apparatus having as an input a program describing system features in a high-level language, characterized in that the apparatus comprises: function extraction means for extracting functions described in the program; analysis means for counting the number of conditional branch statements described in each function extracted by the function extraction means; and calculation means for outputting calculation result information based on the counting results of the analysis means for each function extracted by the function extraction means.

The second aspect of the invention provides a system LSI design support method which supports a design for assigning system features to a system LSI comprising processing units having a plurality of different architectures, characterized in that the method comprises steps of: inputting a program describing system features in a high-level language; extracting functions described in the program; counting the number of conditional branch statements described in each function extracted by the function extraction means; and outputting calculation result information based on the counting results of the analysis means for each function extracted by the function extraction means.

With this configuration, it is possible to adequately assign features provided by the system to processing units having different architectures based on the system LSI design support information concerning the number of conditional branch statements.

The third aspect of the invention provides the system LSI design support apparatus according to the first aspect, characterized in that the analysis means counts the number of nestings of the conditional branch statements described in each function extracted by the function extraction means.

The fourth aspect of the invention provides the system LSI design support method according to the fourteenth aspect, characterized in that the method comprises a step of counting the number of nestings of the conditional branch statements described in the each function extracted.

With this configuration, it is possible to adequately assign features provided by the system to processing units having different architectures based on the system LSI design support information concerning the number of nestings of the conditional branch statements.

The fifth aspect of the invention provides the system LSI design support apparatus according to the first or second aspect, characterized in that, based on the calculation process of variables related to the conditions of the conditional branch statements described in each function extracted by the function extraction means, the analysis means counts the number of functions required to generate the variables.

The sixth aspect of the invention provides the system LSI design support method according to the fourteenth or fifteenth aspect, characterized in that, the method comprises a step of counting, based on the calculation process of variables related to the conditions of the conditional branch statements described in the each function extracted, the number of functions required to generate the variables.

With this configuration, it is possible to adequately assign features provided by the system to processing units having different architectures based on the system LSI design support information concerning the number of functions required to generate the variables related to the conditions of conditional branch statements.

The seventh aspect of the invention provides the system LSI design support apparatus according to any of the first through third aspects, characterized in that the apparatus comprises mapping means for comparing definition information where a plurality of combinations selected out of the preferable number of conditional branch statements processed by the processing unit, the preferable number of nestings of the conditional branch statements and the preferable number of functions required to generate variables related to the conditions of the conditional branch statements are defined per separate processing unit, with calculation result information output from the calculation means to map an appropriate processing unit to each function.

The eighth aspect of the invention provides the system LSI design support method according to any of the fourteenth through sixteenth aspects, characterized in that the method comprises steps of: inputting definition information where a plurality of combinations selected out of the preferable number of conditional branch statements processed by the processing unit, the number of nestings of the conditional branch statements and the number of functions required to generate variables related to the conditions of the conditional branch statements are defined per separate processing unit; and comparing the definition information with the calculation result information to map an appropriate processing unit to each function.

With this configuration, it is possible to adequately assign features provided by the system to processing units having different architectures based on the system LSI design support information concerning a plurality of combinations selected out of the number of conditional branch statements, the number of nestings of the conditional branch statements and the number of functions required to generate variables related to the conditions of the conditional branch statements.

The ninth aspect of the invention provides system LSI design support apparatus which supports a design for assigning system features to a system LSI comprising processing units having a plurality of different architectures, the apparatus having as an input a program describing system features in a high-level language, characterized in that the apparatus comprises: function extraction means for extracting functions described in the program; analysis means for counting the number of loop control statements described in each function extracted by the function extraction means; and calculation means for outputting calculation result information where the counting results of the analysis means are summed for each function extracted by the function extraction means.

The tenth aspect of the invention provides a system LSI design support method which supports a design for assigning system features to a system LSI comprising processing units having a plurality of different architectures, characterized in that the method comprises steps of: inputting a program describing system features in a high-level language; extracting functions described in the program; counting the number of loop control statements described in each function extracted by the function extraction means; and outputting calculation result information based on the counting results of the analysis means for each function extracted by the function extraction means.

With this configuration, it is possible to adequately assign features provided by the system to processing units having different architectures based on the system LSI design support information concerning the number of loop control statements, The eleventh aspect of the invention provides the system LSI design support apparatus according to the fifth aspect, characterized in that the analysis means counts the number of nestings of the loop control statements described in each function extracted by the function extraction means.

The twelfth aspect of the invention provides the system LSI design support method according to the eighteenth aspect, characterized in that the method comprises a step of counting the number of nestings of the loop control statements described in the each function extracted.

With this configuration, it is possible to adequately assign features provided by the system to processing units having different architectures based on the system LSI design support information concerning the number of nestings of the loop control statements.

The thirteenth aspect of the invention provides the system LSI design support apparatus according to the fifth or sixth aspect, characterized in that, based on the calculation process of variables related to the number of repetitions of loop control statements described in each function extracted by the function extraction means, the analysis means counts the number of functions required to generate the variables.

The fourteenth aspect of the invention provides the system LSI design support method according to the eighteenth or nineteenth aspect, characterized in that, the method comprises a step of counting, based on the calculation process of variables related to the number of repetitions of the loop control statements described in the each function extracted, the number of functions required to generate the variables.

With this configuration, it is possible to adequately assign features provided by the system to processing units having different architectures based on the system LSI design support information concerning the number of functions required to generate the variables related to the number of repetitions of loop control statements.

The fifteenth aspect of the invention provides the system LSI design support apparatus according to any of the fifth through seventh aspects, characterized in that the apparatus comprises mapping means for comparing definition information where a plurality of combinations selected out of the preferable number of loop control statements processed by the processing unit, the preferable number of nestings of the loop control statements and the preferable number of functions required to generate variables related to the number of repetitions of the loop control statements are defined per separate processing unit, with calculation result information output from the calculation means to map an appropriate processing unit to each function.

The sixteenth aspect of the invention provides the system LSI design support method according to any of the eighteenth through twentieth aspects, characterized in that the method comprises steps of: inputting definition information where a plurality of combinations selected out of the preferable number of loop control statements processed by the processing unit, the number of nestings of the loop control statements and the number of functions required to generate variables related to the number of repetitions of the loop control statements are defined per separate processing unit; and comparing the definition information with the calculation result information to map an appropriate processing unit to each function.

With this configuration, it is possible to adequately assign features provided by the system to processing units having different architectures based on the system LSI design support information concerning a plurality of combinations selected out of the number of loop control statements, the number of nestings of the loop control statements and the number of functions required to generate variables related to the number of repetitions of the loop control statements.

The seventeenth aspect of the invention provides system LSI design support apparatus which supports a design for assigning system features to a system LSI comprising processing units having a plurality of different architectures, the apparatus having as an input a program describing system features in a high-level language, characterized in that the apparatus comprises: function extraction means for extracting functions described in the program; analysis means for counting the number of conditional branch statements and loop control statements described in each function extracted by the function extraction means; and calculation means for outputting calculation result information based on the counting results of the analysis means for each function extracted by the function extraction means.

The eighteenth aspect of the invention provides a system LSI design support method which supports a design for assigning system features to a system LSI comprising processing units having a plurality of different architectures, characterized in that the method comprises steps of: inputting a program describing system features in a high-level language; extracting functions described in the program; counting the number of conditional branch statements and loop control statements described in each function extracted by the function extraction means; and outputting calculation result information based on the counting results of the analysis means for each function extracted by the function extraction means.

With this configuration, it is possible to adequately assign features provided by the system to processing units having different architectures based on the system LSI design support information concerning the number of conditional branch statements and loop control statements.

The nineteenth aspect of the invention provides the system LSI design support apparatus according to the ninth aspect, characterized in that the analysis means counts the number of nestings of the conditional branch statements and loop control statements described in each function extracted by the function extraction means.

The twentieth aspect of the invention provides the system LSI design support method according to the twenty-second aspect, characterized in that the method comprises a step of counting the number of nestings of the conditional branch statements and loop control statements described in the each function extracted.

With this configuration, it is possible to adequately assign features provided by the system to processing units having different architectures based on the system LSI design support information concerning the number of nestings of the conditional branch statements and loop control statements.

The twenty-first aspect of the invention provides the system LSI design support apparatus according to the ninth or tenth aspect, characterized in that, based on the calculation process of variables related to the number of repetitions of the conditional branch statements and loop control statements described in each function extracted by the function extraction means, the analysis means counts the number of functions required to generate the variables.

The twenty-second aspect of the invention provides the system LSI design support method according to the twenty-second or twenty-third aspect, characterized in that, the method comprises a step of counting, based on the calculation process of variables related to the conditions of the conditional branch statements and those related to the number of repetitions of the loop control statements described in the each function extracted, the number of functions required to generate the variables.

With this configuration, it is possible to adequately assign features provided by the system to processing units having different architectures based on the system LSI design support information concerning the number of functions required to generate the variables related to the conditions of conditional branch statements and those related to the number of repetitions of the loop control statements.

The twenty-third aspect of the invention provides the system LSI design support apparatus according to any of the ninth through eleventh aspects, characterized in that the apparatus comprises mapping means for comparing definition information where a plurality of combinations selected out of the preferable number of conditional branch statements and loop control statements processed by the processing unit, the preferable number of nestings of the conditional branch statements and loop control statements, and the preferable number of functions required to generate variables related to the number of repetitions of the conditional branch statements and loop control statements are defined per separate processing unit, with calculation result information output from the calculation means to map an appropriate processing unit to each function.

The twenty-fourth aspect of the invention provides the system LSI design support method according to any of the twenty-second through twenty-fourth aspects, characterized in that the method comprises steps of: inputting definition information where a plurality of combinations selected out of the preferable number of conditional branch statements and loop control statements processed by the processing unit, the preferable number of nestings of the conditional branch statements and loop control statements, and the preferable number of functions required to generate variables related to the conditions of the conditional branch statements and those related to the number of repetitions of the loop control statements are defined per separate processing unit; and comparing the definition information with the calculation result information to map an appropriate processing unit to each function.

With this configuration, it is possible to adequately assign features provided by the system to processing units having different architectures based on the system LSI design support information concerning a plurality of combinations selected out of the number of conditional branch statements and loop control statements, the number of nestings of the conditional branch statements and loop control statements, and the number of functions required to generate variables related to the conditions of the conditional branch statements and those related to the number of repetitions of the loop control statements.

The twenty-fifth aspect of the invention provides the system LSI design support apparatus according to any of the first through twelfth aspects, characterized in that the function extraction means comprises function combination means for specifying at least one of the plurality of sets of functions arbitrarily selected from the functions extracted by the function extraction means and that the analysis means performs analysis of each set of functions specified by the function combination means.

The twenty-sixth aspect of the invention provides the system LSI design support method according to any of the fourteenth through twenty-fifth aspects, the method comprising a step of specifying at least one of the plurality of sets of functions arbitrarily selected from the functions extracted, characterized in that the method performs the calculation of each of the specified sets of functions.

With this configuration, it is possible to adequately assign features provided by the system to processing units having different architectures based on the system LSI design support information concerning the case where functions related to each other are processed by the same processing unit.

The twenty-seventh aspect of the invention provides database apparatus for storing data to be provided to system LSI design support apparatus which supports a design for assigning system features to a system LSI comprising processing units having a plurality of different architectures, characterized in that the data concerns to a program describing system features in a high-level language and that the data is definition information where a preferable number of conditional branch statements processed by the processing unit is defined per separate processing unit.

With this configuration, it is possible to provide data used to generate system LSI design support information concerning conditional branch statements to LSI design support apparatus.

The twenty-eighth aspect of the invention provides database apparatus for storing data to be provided to system LSI design support apparatus which supports a design for assigning system features to a system LSI comprising processing units having a plurality of different architectures, characterized in that the data concerns to a program describing system features in a high-level language and that the data is definition information where a preferable number of loop control statements processed by the processing unit is defined per separate processing unit.

With this configuration, it is possible to provide data used to generate system LSI design support information concerning loop control statements to LSI design support apparatus.

The twenty-ninth aspect of the invention provides database apparatus for storing data to be provided to system LSI design support apparatus which supports a design for assigning system features to a system LSI comprising processing units having a plurality of different architectures, characterized in that the data concerns to a program describing system features in a high-level language and that the data is definition information where a preferable number of conditional branch statements and loop control statements processed by the processing unit is defined per separate processing unit.

With this configuration, it is possible to provide data used to generate system LSI design support information concerning conditional branch statements and loop control statements to LSI design support apparatus.

BRIEF DESCRIPTION OF THE DRAWINGS

FIG. 2 is an example of description of a program stored into an auxiliary memory in Embodiment 1;

FIG. 3 is a flowchart showing the flow of analysis in a function according to Embodiment 1;

FIG. 4 is a schematic view of a conceptual chart of a calculation result example;

FIG. 6 is a schematic view of a conceptual chart of a calculation result example;

FIG. 7 is an example of description of a program stored into an auxiliary memory in Embodiment 3;

FIG. 10 is an example of description of a program stored into an auxiliary memory in Embodiment 4;

FIG. 11 is a flowchart showing the flow of analysis in a function according to Embodiment 4;

FIG. 12 is a schematic view of a conceptual chart of a calculation result example;

FIG. 14 is a schematic view of a conceptual chart of a calculation result example;

FIG. 15 is an example of description of a program stored into an auxiliary memory in Embodiment 6;

FIG. 19 is a schematic view of a conceptual chart of a calculation result example;

FIG. 21 is a schematic view of a conceptual chart of a calculation result example;

FIG. 22 is a schematic view of a conceptual chart of a calculation result example;

FIG. 23 is a block diagram showing the configuration of the system LSI design support apparatus according to Embodiment 10 of the invention;

FIG. 24 is a schematic view of a conceptual chart of a condition example concerning a conditional branch statement used to assign processing units FIG. 25 is a schematic view of a conceptual chart of mapping results;

FIG. 26 is a schematic view of a conceptual chart of a condition example concerning a loop control statement used to assign processing units;

FIG. 27 is a schematic view of a conceptual chart of mapping results;

FIG. 28 is a schematic view of a conceptual chart of a condition example for assigning processing units;

FIG. 29 is a schematic view of a conceptual chart of the relationship between the items of conditions for assigning processing units and a weighting factor; and FIG. 30 is a schematic view of a conceptual chart of mapping results.

DESCRIPTION OF THE PREFERRED EMBODIMENTS

Embodiments of the invention are described referring to drawings. A system LSI which performs design by using a system LSI design support apparatus comprises a plurality of processing units (a CPU, a DSP and a dedicated logic) having different architectures (configuration of the system LSI is not shown).

(Embodiment 1)

Figure 1:
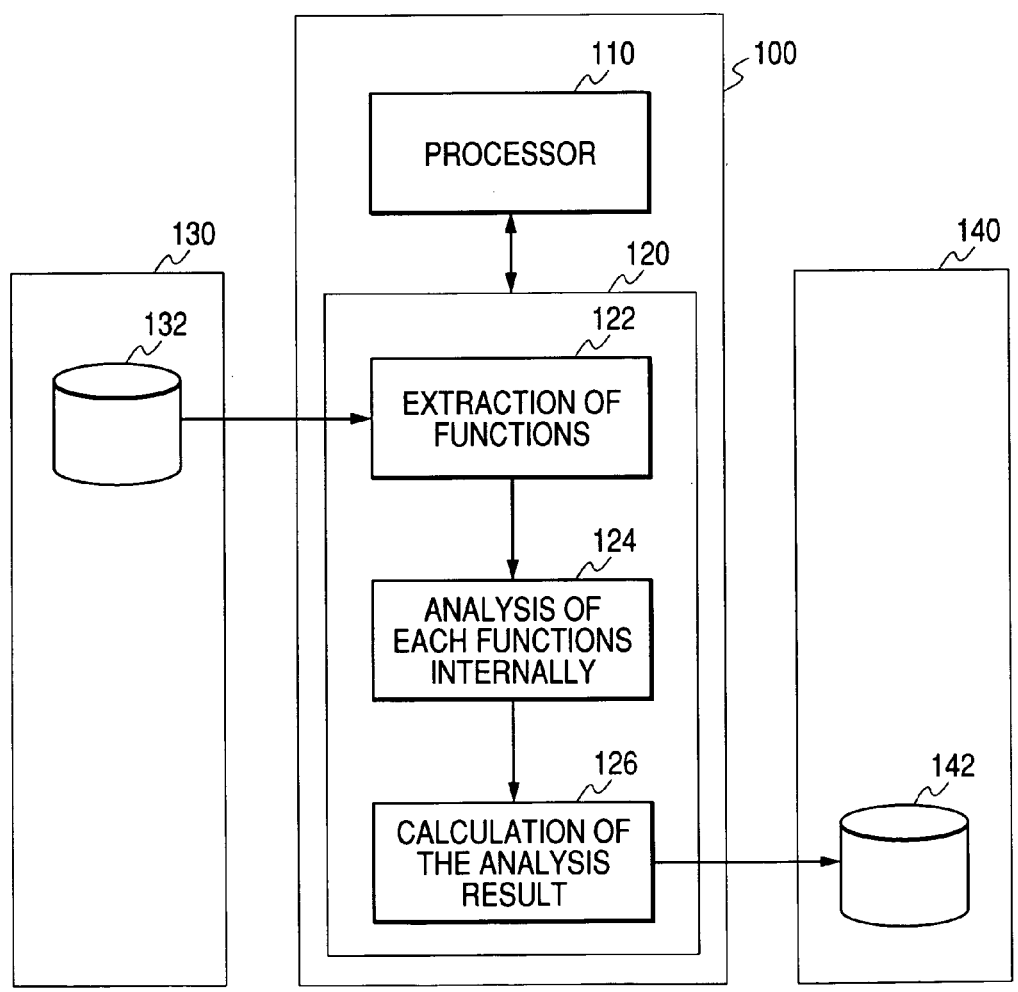
FIG. 1 is a block diagram showing the configuration of the system LSI design support apparatus according to Embodiment 1 of the invention.

FIG. 1 is a block diagram showing the configuration of the system LSI design support apparatus according to Embodiment 1 of the invention. In FIG. 1, a computer 100 comprises a processor 110 and a main memory 120. The processor 110 performs various arithmetic operations and general control of the system LSI design support apparatus. The main memory 120 stores programs and data describing procedures related to the operation of the system LSI design support apparatus. An auxiliary memory 130 stores data to be input to the computer 100. An auxiliary memory 140 stores data to be output from the computer 100.

A program 132 describing part or whole of system features in a high-level language is previously stored in the auxiliary memory 130 (the storage means is not shown). FIG. 2 is an example of description of the program 132 stored into an auxiliary memory in Embodiment 1. As shown in FIG. 2, the program is described in the C language and comprises a plurality of functions.

Next, the operation of the system LSI design support apparatus thus configured is described below. When the program 132 is input to the computer 1000, various types of processing are executed in the order of a function extraction section 122, an analysis section 124, and a calculation section 126 in the main memory 120.

The function extraction section 122 extracts functions described in the program 132. In case the programs 132 is as shown in FIG. 2, func_A, func_B and func_C are extracted as functions. The analysis section 124 calculates the number of conditional branch statements per extracted function.

FIG. 3 is a flowchart showing the flow of analysis in a function according to Embodiment 1. The analysis section 124 selects one of the functions extracted by the function extraction section 122 (step S101). In case the program 132 is as shown in FIG. 2, func_A is selected first. Next, the number of conditional branch statements contained in the function is counted (step S102). In the func_A in FIG. 2, an if statement is used as a conditional branch statement and the number of if statements is three, the if statements being an if statement 211, an if statement 212 and an if statement 213. The number of the conditional branch statements, in this case 3, is recorded (step S103). It is determined whether the above processing is complete for all the functions (step S104). In case it is not complete, processing is repeated from step S101. In case it is complete, execution proceeds to the processing in the calculation section 126.

The calculation section 126 sums up the number of conditional branch statements obtained by the analysis section 124 and generates calculation results. FIG. 4 is a schematic view of a conceptual chart of a calculation result example. The calculation result information 142 is stored into the auxiliary memory 140.

The configuration of Embodiment 1 provides the function-based characteristics of the program 132 describing system features. For example, design support information is obtained: func_B uses 10 conditional branch statements in the above program example, thus it is appropriate to process this function on a CPU which allows efficient conditional judgment.

(Embodiment 2)

System LSI design support apparatus according to Embodiment 2 of the invention is described below referring to FIGS. 1, 2, 5 and 6.

Embodiment 2 differs from Embodiment 1 in that the analysis section 124 in FIG. 1 also counts the number of loop control statements per extracted function.

Figure 5:
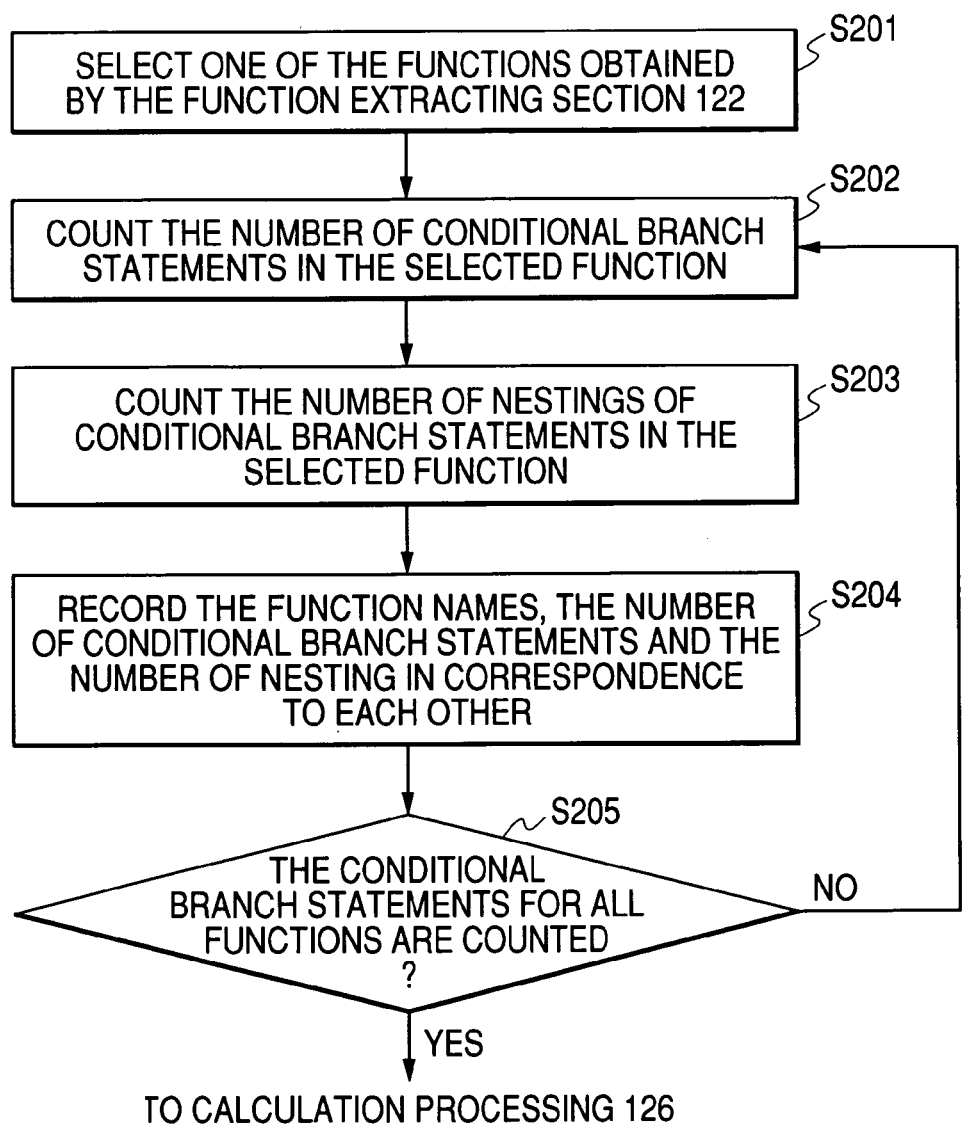
FIG. 5 is a flowchart showing the flow of analysis in a function according to Embodiment 2.

FIG. 5 is a flowchart showing the flow of analysis in a function according to Embodiment 2. The analysis section 124 selects one of the functions extracted by the function extraction section 122 (step S201). In case the program 132 is as shown in FIG. 2, func_A is selected first. Next, the number of conditional branch statements contained in the function is counted (step S202). In FIG. 2, total three if statements are counted. Further, the number of nestings (number of nested stages) of conditional branch statements contained in the function and the number of target conditional branch statements are counted (step S203). An if statement 212 in func_A in FIG. 2 has a single-stage nesting structure in an if statement 211. Thus, the number of conditional branch statements of a single-stage nesting is counted as one, which number is recorded (step S204). It is determined whether the above processing is complete for all the functions (step S205). In case it is not complete, processing is repeated from step S201. In case it is complete, execution proceeds to the processing in the calculation section 126.

The calculation section 126 sums up the number of conditional branch statements obtained by the analysis section 124 and generates calculation results. FIG. 6 is a schematic view of a conceptual chart of a calculation result example. The calculation result information 142 is stored into the auxiliary memory 140.

The configuration of Embodiment 2 provides the function-based characteristics of the program 132 from a viewpoint other than that of Embodiment 1. In general, the more the number of nesting stages of conditional branch is, the more complicated the processing will be, and the more difficult the execution using a dedicated logic will be. For example, design support information is obtained: func_A uses nested conditional branch statements in the above program example, thus it is appropriate to process this function on a CPU which allows efficient conditional judgment.

(Embodiment 3)

System LSI design support apparatus according to Embodiment 3 of the invention is described below referring to FIGS. 1, 7, 8 and 9.

Embodiment 3 differs from Embodiments 1 and 2 in that the analysis section 124 in FIG. 1 tracks the process of generating the conditions of the conditional branch statements per extracted function and calculates the number of functions required to generate conditional variables in order to analyze the internal syntax. FIG. 7 is an example of description of the program 132 stored into an auxiliary memory in Embodiment 3.

Figures 8, 9:
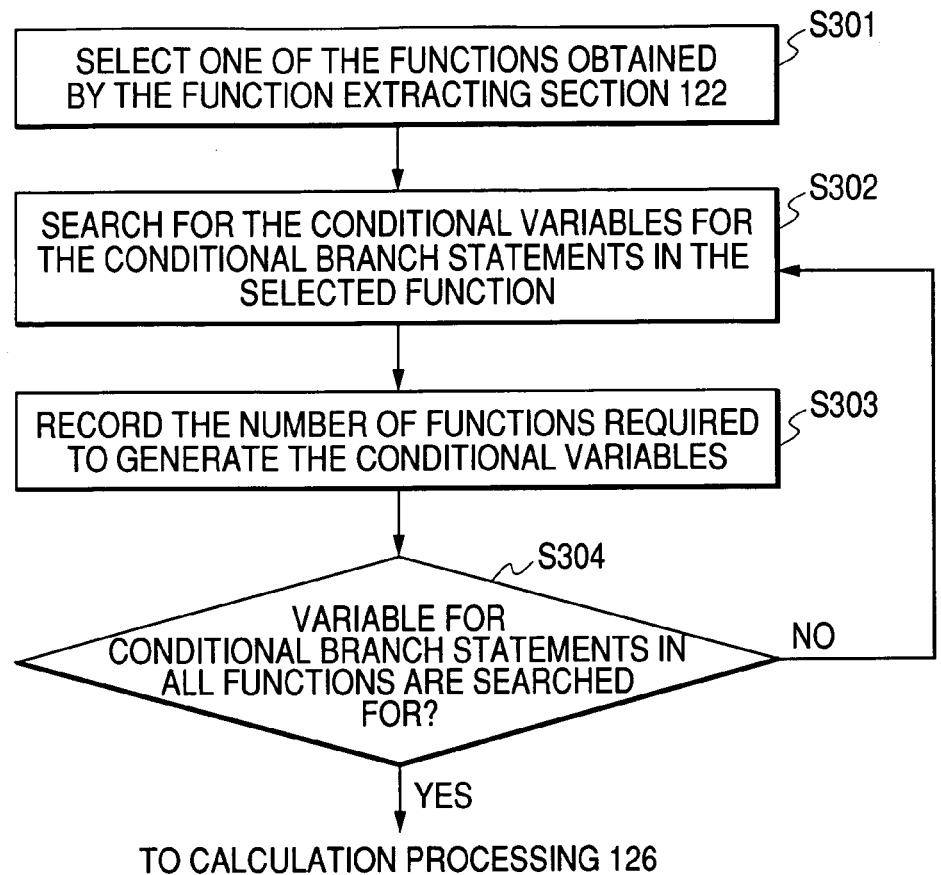
FIG. 8 is a flowchart showing the flow of analysis in a function according to Embodiment 3.
FIG. 9 is a schematic view of a conceptual chart of a calculation result example.

FIG. 8 is a flowchart showing the flow of analysis in a function according to Embodiment 13. The analysis section 124 selects one of the functions extracted by the function extraction section 122 (step S301). In case the program 132 is as shown in FIG. 7, func_A is selected first. Next, it is analyzed via how many functions are generated variables related to the conditions used by the conditional branch statements contained in the function (step S302). Assume that a variable AIN1 used in the conditional branch statement 211 in FIG. 7 is calculated in a function external to func_A and that a variable AIN2 is given as a constant from outside. As shown in FIG. 7, the variable AIN1 is calculated in func_D, and the variable AIN1 is generated by way of func_A1 and func_A2 described in the two statements 711, 722 in func_D. Thus, the number of functions required to generate AIN1 is 2. The variable AIN2 is given as a constant from outside so that the number of functions required for its generation is 0. Based on such an analysis, the number of functions required to generate conditional variables and the number of variables are recorded (step S303). It is determined whether the above processing is complete for all the functions (step S304). In case it is not complete, processing is repeated from step S301. In case it is complete, execution proceeds to the processing in the calculation section 126.

The calculation section 126 sums up the number of conditional branch statements, the number of functions required to generate conditional variables and the number of variables obtained by the analysis section 124 and generates calculation results. FIG. 9 is a schematic view of a conceptual chart of a calculation result example. The calculation result information 142 is stored into the auxiliary memory 140.

The configuration of Embodiment 3 provides the function-based characteristics of the program 132 from a viewpoint other than that of Embodiments 1 and 2. In general, the more procedures are used to generate variables used for conditional branch, the more complicated the processing will be, and the more difficult the execution using a dedicated logic will be. For example, design support information is obtained: two functions are required to generate variables used in the conditional branch statements for func_A, thus it is appropriate to process this function on a CPU which allows efficient conditional judgment.

(Embodiment 4)

System LSI design support apparatus according to Embodiment 4 of the invention is described below referring to FIGS. 1, 10, 11 and 12.

Embodiment 4 differs from Embodiments 1 through 3 in that the analysis section 124 in FIG. 1 counts the number of loop control statements per extracted function. FIG. 10 is an example of description of the program 132 stored into an auxiliary memory in Embodiment 4.

FIG. 11 is a flowchart showing the flow of analysis in a function according to Embodiment 4. The analysis section 124 selects one of the functions extracted by the function extraction section 122 (step S401). In case the program 132 is as shown in FIG. 10, func_LA is selected first. Next, the number of loop control statements contained in the function is counted (step S402). In the func_LA in FIG. 10, a for statement is used as a loop control statement and the number of for statements is three, the for statements being a for statement 1011, a for statement 1012 and a for statement 1013. The number of the loop control statements, in this case 3, is recorded (step S403). It is determined whether the above processing is complete for all the functions (step S404). In case it is not complete, processing is repeated from step S401. In case it is complete, execution proceeds to the processing in the calculation section 126.

The calculation section 126 sums up the number of loop control statements obtained by the analysis section 124 and generates calculation results. FIG. 12 is a schematic view of a conceptual chart of a calculation result example. The calculation result information 142 is stored into the auxiliary memory 140.

The configuration of Embodiment 4 provides the function-based characteristics of the program 132 describing system features. For example, design support information is obtained: func_LB uses 10 loop control statements in the above program example, thus it is appropriate to process this function on a CPU which allows efficient loop control.

(Embodiment 5)

System LSI design support apparatus according to Embodiment 5 of the invention is described below referring to FIGS. 1, 10, 13 and 14.

Embodiment 5 differs from Embodiments 1 through 4 in that the analysis section 124 in FIG. 1 also counts the number of nestings of loop control statements per extracted function.

Figure 13:
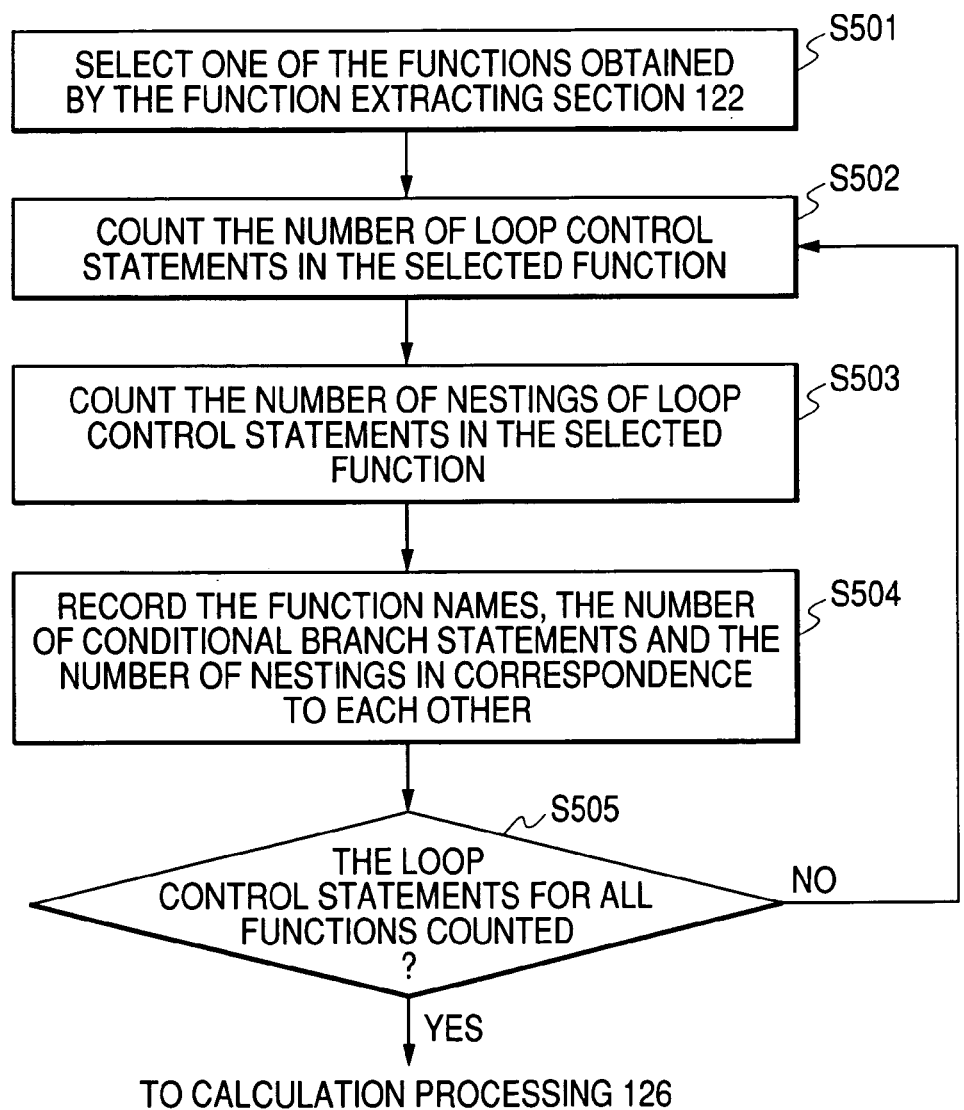
FIG. 13 is a flowchart showing the flow of analysis in a function according to Embodiment 5.

FIG. 13 is a flowchart showing the flow of analysis in a function according to Embodiment 5. The analysis section 124 selects one of the functions extracted by the function extraction section 122 (step S501). In case the program 132 is as shown in FIG. 10, func_LA is selected first. Next, the number of loop control statements contained in the function is counted (step S502). In FIG. 10, total three for statements are counted. Further, the number of nestings (number of nested stages) of the loop control statements contained in the function and the number of target loop control statements are counted (step S503). A for statement 1012 in func_LA in FIG. 10 has a single-stage nesting structure in a for statement 1011. Thus, the number of loop control statements of a single-stage nesting is counted as one, which number is recorded (step S504). It is determined whether the above processing is complete for all the functions (step S505). In case it is not complete, processing is repeated from step S501. In case it is complete, execution proceeds to the processing in the calculation section 126.

The calculation section 126 sums up the number of loop control statements and the number of nestings obtained by the analysis section 124 and generates calculation results. FIG. 14 is a schematic view of a conceptual chart of a calculation result example. The calculation result information 142 is stored into the auxiliary memory 140.

The configuration of Embodiment 5 provides the function-based characteristics of the program 132 from a viewpoint other than that of Embodiment 4. In general, the more the number of nesting stages of a loop control statement is, the more complicated the processing will be, and the more difficult the execution using a dedicated logic will be. For example, design support information is obtained: func_LA uses nested loop control statements in the above program example, thus it is appropriate to process this function on a DSP incorporated in a system LSI.

(Embodiment 6)

System LSI design support apparatus according to Embodiment 6 of the invention is described below referring to FIGS. 1, 15, 16 and 17.

Embodiment 6 differs from Embodiments 1 through 5 in that the analysis section 124 in FIG. 1 tracks the process of generating variables used for indicating the number of repetitions in loop control statement per extracted function and calculates the number of functions required to generate conditional variables in order to analyze the internal syntax. FIG. 15 is an example of description of the program 132 stored into an auxiliary memory in Embodiment 6.

Figures 16, 17:
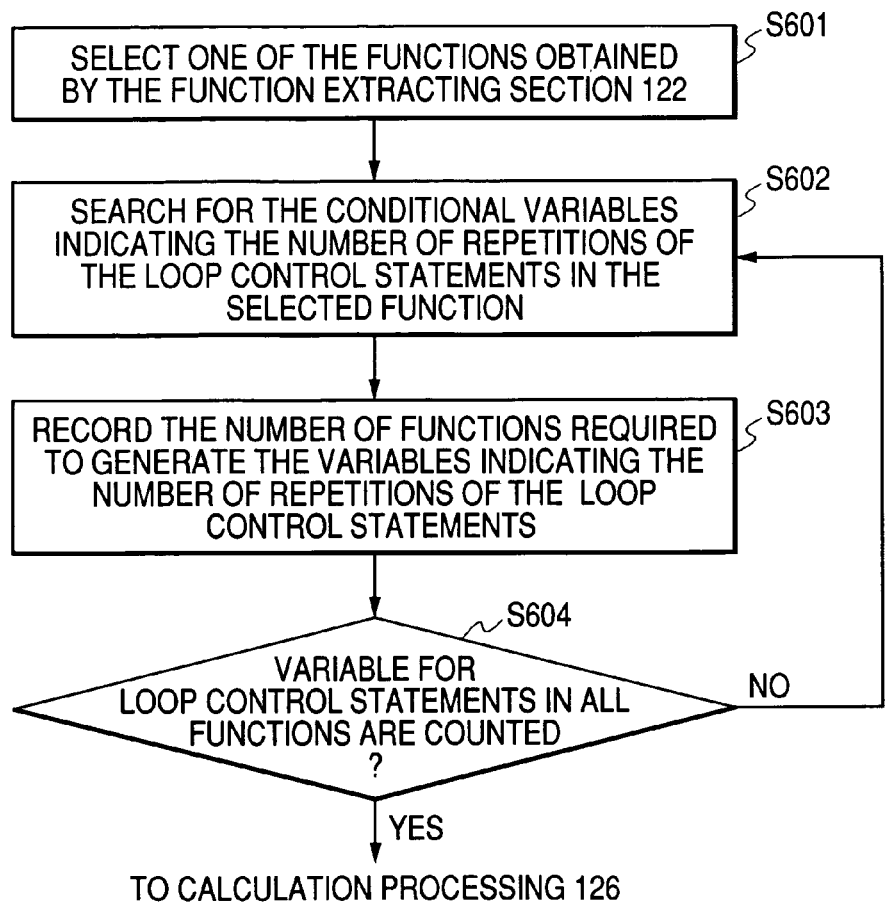
FIG. 16 is a flowchart showing the flow of analysis in a function according to Embodiment 6.
FIG. 17 is a schematic view of a conceptual chart of a calculation result example.

FIG. 16 is a flowchart showing the flow of analysis in a function according to Embodiment 6. The analysis section 124 selects one of the functions extracted by the function extraction section 122 (step S601). In case the program 132 is as shown in FIG. 15, func_LA is selected first. Next, it is analyzed via how many functions are generated variables related to the number of repetitions in loop control statement contained in the function (step S602). Assume that a variable AIN1 used for indicating the number of repetitions in loop control statement in FIG. 15 is calculated in func_LD, and the variable AIN1 is generated by way of func_LA1 and func_LA2 described in the two statements 1511, 1512 in func_LD. Thus, the number of functions required to generate AIN1 is 2. Based on such an analysis, the number of functions required to generate conditional variables and the number of variables are recorded (step S603). It is determined whether the above processing is complete for all the functions (step S604). In case it is not complete, processing is repeated from step S601. In case it is complete, execution proceeds to the processing in the calculation section 126.

The calculation section 126 sums up the number of loop control statements, the number of functions required to generate conditional variables and the number of variables obtained by the analysis section 124 and generates calculation results. FIG. 17 is a schematic view of a conceptual chart of a calculation result example. The calculation result information 142 is stored into the auxiliary memory 140.

The configuration of Embodiment 6 provides the function-based characteristics of the program 132 from a viewpoint other than that of Embodiment 5. In general, the more procedures are used to generate variables used for indicating the number of repetitions in loop control, the more complicated the processing will be, and the more difficult the execution using a dedicated logic will be. For example, design support information is obtained: two functions are required to generate variables used in the loop control statements for func_LA, thus it is appropriate to process this function on a DSP incorporated in a system LSI.

(Embodiment 7)

System LSI design support apparatus according to Embodiment 7 of the invention is described below referring to FIGS. 1, 18 and 19.

In Embodiment 7, the analysis section 124 in FIG. 1 counts, per extracted function, the number of conditional branch statements and the number of loop control statements and the number of nestings of the conditional branch statements and the number of nestings of the loop control statements. Further, the analysis section 124 tracks the process of generating the conditions of the conditional branch statements and the number of repetitions of the loop control statements and calculates the number of functions required to generate variables in the conditional branch statements and the number of functions required to generate the variables in the loop control statements in order to analyze the internal syntax. It is assumed that the program 132 according to this embodiment is a program including the details shown in FIGS. 2, 7, 10 and 15.

Figure 18:
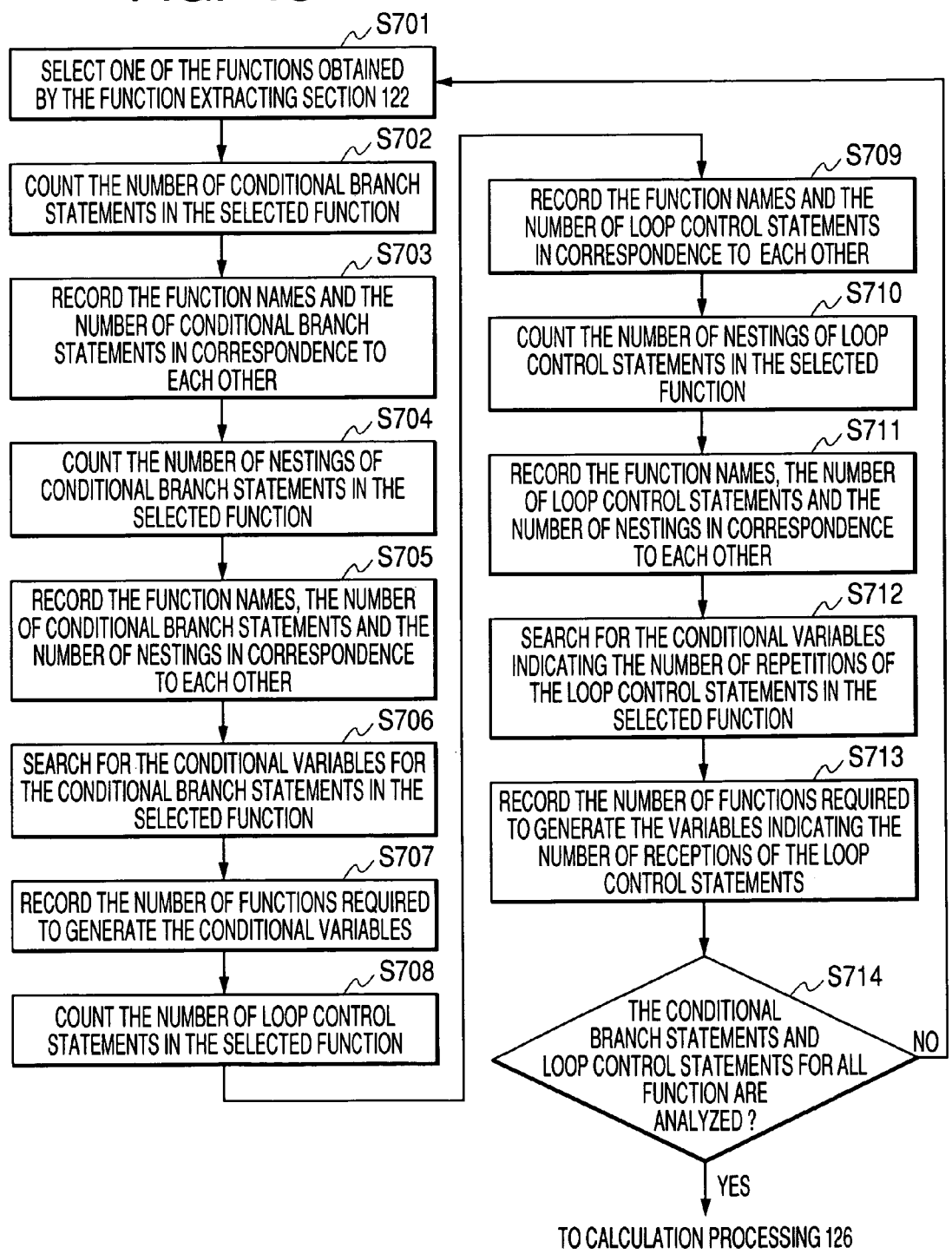
FIG. 18 is a flowchart showing the flow of analysis in a function according to Embodiment 7.

FIG. 18 is a flowchart showing the flow of analysis in a function according to Embodiment 7. The analysis section 124 selects one of the functions extracted by the function extraction section 122 (step S701). The analysis section 124 then counts the number of conditional branch statements contained in the function (step S702) and records the number of the conditional branch statements (step S703). Next, the analysis section 124 counts the number of nestings (number of nested stages) of the conditional branch statements contained in the function and the number of target conditional branch statements (step S704), then records the number of nestings (step S705). Next, the analysis section 124 tracks via how many functions are generated variables related to the conditions of the conditional branch statements contained in this function (step S706), and records the number of functions required to generate the conditional variables (step S707).

The analysis section 124 then counts the number of loop control statements contained in the function (step S708) and records the number of the loop control statements (step S709) Next, the analysis section 124 counts the number of nestings (number of nested stages) of the loop control statements contained in the function and the number of target loop control statements (step S710), then records the number of nestings (step S711). Next, the analysis section 124 tracks via how many functions are generated variables related to the number of repetitions used in the loop control statements contained in this function (step S712), and records the number of functions required to generate the conditional variables (step S713). It is determined whether the above processing is complete for all the functions (step S714). In case it is not complete, processing is repeated from step S701. In case it is complete, execution proceeds to the processing in the calculation section 126.

The calculation section 126 sums up the number of conditional branch statements and the number of loop control statements, the number of nestings of the conditional branch statements and the number of nestings of the loop control statements, and the number of functions required to generate variables in the conditional branch statements and the number of functions required to generate variables in the loop control statements and generates calculation results. FIG. 19 is a schematic view of a conceptual chart of a calculation result example. The calculation result information 142 is stored into the auxiliary memory 140.

The configuration of Embodiment 7 provides the function-based characteristics of the program 132 from a viewpoint of Embodiments 1 through 6 thereby providing comprehensive design support information.

(Embodiment 8)

System LSI design support apparatus according to Embodiment 8 of the invention is described below referring to FIGS. 7, 8, 20 and 21.

Figure 20:
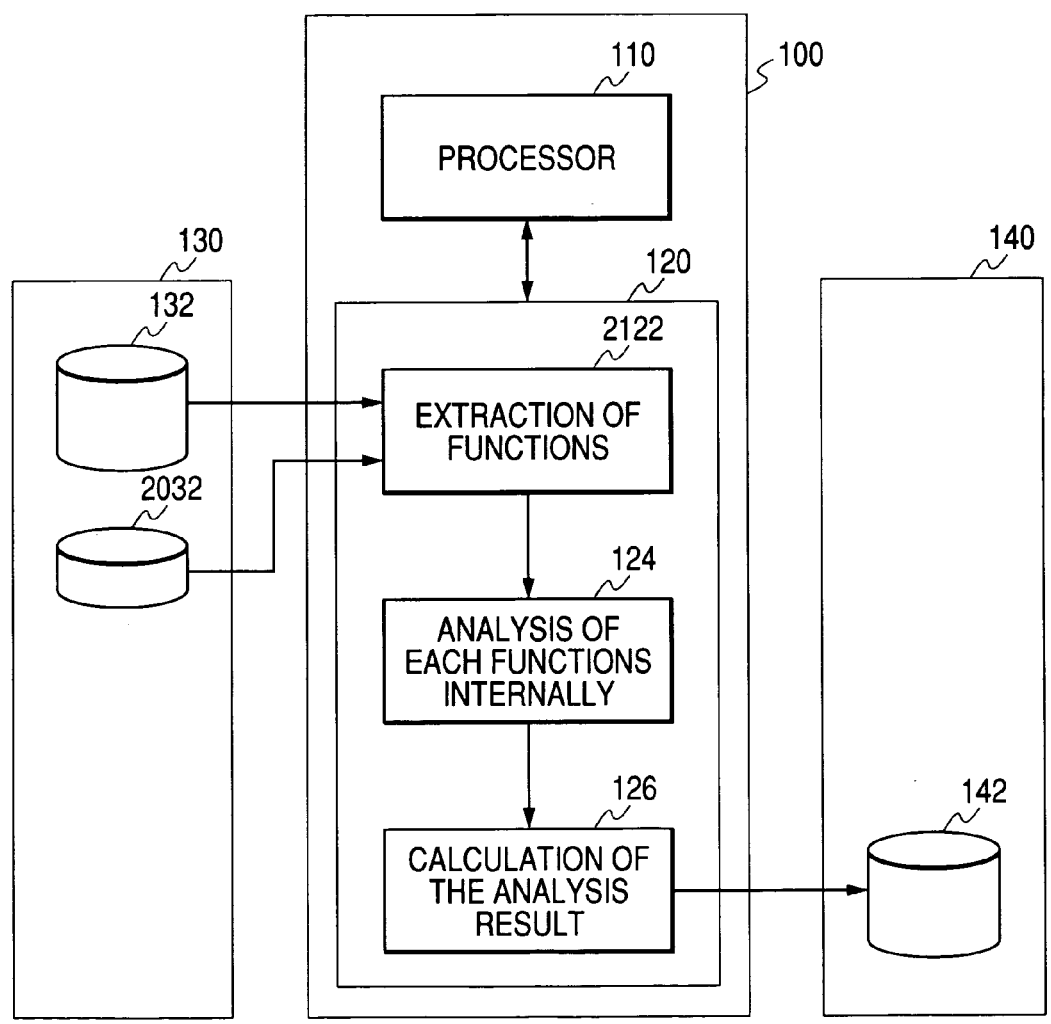
FIG. 20 is a block diagram showing the configuration of the system LSI design support apparatus according to Embodiment 8 of the invention.

Embodiment 8 differs from Embodiments 1 through 7 in that analysis is made on a "set" of a plurality of functions instead of tracking the process of generating the conditions of conditional branch statements per extracted function. FIG. 20 is a block diagram showing the configuration of the system LSI design support apparatus according to Embodiment 8 of the invention. An auxiliary memory 130 stores the program 132 as well as a file 2032. The file 2032 has a list of "sets" of a plurality of arbitrarily selected functions. A function extraction section 2122 extracts the functions described in the program 132 and references the list of "sets" specified in the file 2032 to select a specific function. The subsequent analysis and calculation are executed on the "sets" rather than individual functions.

Operation of the system LSI design support apparatus of the above configuration is described below. The program 132 according to this embodiment is described as a program including the details shown in FIG. 7.

The function extraction section 2122 extracts the functions described in the program 132 and references the file 2032. In the file 2032, a plurality of functions closely related to each other in the program 132 are prespecified as a "set" by the designer. For example, func_A in the program of FIG. 7 and func_D generating a variable AIN1 used by func_A are closely related to each other so that they are desirably processed by a same processing unit. In this case, specifying to the file 2032 func_A and func_D as a "set" of functions to be analyzed allows the two functions to be selected at the same time and the subsequent processing is executed on the two functions.

The analysis section 124 performs analysis same as the flowchart of FIG. 8. In this example, the number of conditional branch statements and the number of functions required to generate conditional variables in the two functions func_A and func_B (or specified "set") are counted.

The calculation section 126 sums up the number of conditional branch statements and the number of functions required to generate conditional variables obtained by the analysis section 124 and generates the calculation results. FIG. 21 is a schematic view of a conceptual chart of a calculation result example. The calculation result information 142 is stored into the auxiliary memory 140.

As understood from the above, in order to execute analysis concerning a conditional branch statement on a previously specified "set" of functions, for example, analysis of func_A and func_D closely related to each other by way of separate processing units is previously excluded. This obtains appropriate design support information related to the system LSI design.

(Embodiment 9)

System LSI design support apparatus according to Embodiment 9 of the invention is described below referring to FIGS. 15, 16, 20 and 22.

Embodiment 9 differs from Embodiments 1 through 8 in that analysis is made on a "set" of a plurality of functions instead of tracking the process of generating the number of repetitions of loop control statements per extracted function, and that the analysis made by the analysis section 124 in FIG. 20 is processing related to loop control statements rather than processing related to conditional branch statements.

Operation of the system LSI design support apparatus of the above configuration is described below. The program 132 according to this embodiment is described as a program including the details shown in FIG. 15.

The function extraction section 2122 extracts the functions described in the program 132 and references the file 2032. In the file 2032, a plurality of functions closely related to each other in the program 132 are prespecified as a "set" by the designer. For example, func_LA in the program of FIG. 15 and func_LD generating a variable AIN1 used by func_LA are closely related to each other so that they are desirably processed by a same processing unit. In this case, specifying to the file 2032 func_LA and func_LD as a "set" of functions to be analyzed allows the two functions to be selected at the same time and the subsequent processing is executed on the two functions.

The analysis section 124 performs analysis same as the flowchart of FIG. 16. In this example, the number of loop control statements and the number of functions required to generate the number of repetitions in the two functions func_LA and func_LB (or specified "set") are counted.

The calculation section 126 sums up the number of loop control statements and the number of functions required to generate the number of repetitions obtained by the analysis section 124 and generates the calculation results. FIG. 22 is a schematic view of a conceptual chart of a calculation result example. The calculation result information 142 is stored into the auxiliary memory 140.

As understood from the above, in order to execute analysis concerning a conditional branch statement on a previously specified "set" of functions, for example, analysis of func_LA and func_LD closely related to each other by way of separate processing units is previously excluded. This obtains appropriate design support information related to the system LSI design.

(Embodiment 10)

System LSI design support apparatus according to Embodiment 10 of the invention is described below referring to FIGS. 2, 3, 4, 23 24 and 25.

Embodiment 10 differs from Embodiments 1 through 9 in that the main memory 120 further includes a mapping section 2328 for mapping an appropriate processing unit to each function based on the information describing the conditions related to functions used to assign processing units. FIG. 23 is a block diagram showing the configuration of the system LSI design support apparatus according to Embodiment 10 of the invention. An auxiliary memory 130 stores the program 132 as well as information (or a library) 2332 describing the conditions related to functions used to assign processing units. FIG. 24 is a schematic view of a conceptual chart of a condition example concerning a conditional branch statement used to assign processing units.

Operation of the system LSI design support apparatus of the above configuration is described below. The program 132 according to this embodiment is described as a program including the details shown in FIG. 2.

The function extraction section 122 extracts functions described in the program 132. The analysis section 124 counts the number of conditional branch statements per extracted function, same as the flowchart of FIG. 3. The calculation section 126 sums up the number of conditional branch statements obtained by the analysis section 124 and generates calculation results shown in FIG. 4.

The mapping section 2328 references the library 2332 to map an appropriate processing unit to each function based on the calculation results obtained. For example, as shown in FIG. 4, func_A has three conditional branch statements. Referencing the library 2332 (FIG. 24), it is understood that the processing unit corresponding to three conditional branch statements is DSP. In other words, design support information is obtained that func_A is adequately processed on DSP. FIG. 25 is a schematic view of a conceptual chart of mapping results. In this way, an appropriate processing unit is mapped to each function used in the program 132. The mapping results information 2342 is stored into the auxiliary memory 140.

As mentioned above, by mapping an appropriate processing unit to each function contained in the program 132 from the viewpoint of processing conditional branch statements, it is possible to obtain appropriate design support information related to the system ISI design.

(Embodiment 11)

System LSI design support apparatus according to Embodiment 11 of the invention is described below referring to FIGS. 10, 11, 12, 23, 26 and 27.

Embodiment 11 differs from Embodiments 1 through 10 in that the main memory 120 further includes a mapping section 2328 for mapping an appropriate processing unit to each function based on the information describing the conditions related to functions used to assign processing units. Embodiment 11 differs from Embodiment 10 in that the library 2332 describes the condition concerning the number of loop control statements rather than the number of conditional branch statements. FIG. 26 is a schematic view of a conceptual chart of a condition example concerning a loop control statement used to assign processing units.

Operation of the system LSI design support apparatus of the above configuration is described below. The program 132 according to this embodiment is described as a program including the details shown in FIG. 10.

The function extraction section 122 extracts functions described in the program 132. The analysis section 124 counts the number of loop control statements per extracted function, same as the flowchart of FIG. 11. The calculation section 126 sums up the number of loop control statements obtained by the analysis section 124 and generates calculation results shown in FIG. 12.

The mapping section 2328 references the library 2332 to map an appropriate processing unit to each function based on the calculation results obtained. For example, as shown in FIG. 12, func_B has 10 loop control statements. Referencing the library 2332 (FIG. 26), it is understood that the processing unit corresponding to 10 loop control statements is DSP. In other words, design support information is obtained that func_B is adequately processed on DSP. FIG. 27 is a schematic view of a conceptual chart of mapping results. In this way, an appropriate processing unit is mapped to each function used in the program 132. The mapping results information 2342 is stored into the auxiliary memory 140.

As mentioned above, by mapping an appropriate processing unit to each function contained in the program 132 from the viewpoint of processing loop control statements, it is possible to obtain appropriate design support information related to the system ISI design.

(Embodiment 12)

System LSI design support apparatus according to Embodiment 12 of the invention is described below referring to FIGS. 18, 19, 23, 28, 29 and 30.

Embodiment 12 differs from Embodiments 1 through 11 in that the library 2332 in FIG. 23 contains the conditions concerning the number of conditional branch statements and the number of loop control statements as well as the number of nestings of conditional branch statements and loop control statements and the number of functions required to generate conditional variables. FIG. 28 is a schematic view of a conceptual chart of a condition example for assigning processing units.

Operation of the system LSI design support apparatus of the above configuration is described below. The program 132 according to this embodiment is described as a program including the details shown in FIGS. 2, 7, 10 and 15.

The function extraction section 122 extracts functions described in the program 132. Same as the flowchart of FIG. 18, the analysis section 124 counts, per extracted function, the number of conditional branch statements and the number of loop control statements, the number of nestings of conditional branch statements and the number of nestings of loop control statements, and the number of functions required to generate the variables in the conditional branch statements and the variables in the loop control statements. The calculation section 126 sums up the number of conditional branch statements obtained by the analysis section 124 and generates calculation results shown in FIG. 19.

The mapping section 2328 references the library 2332 to map an appropriate processing unit to each function based on the calculation results obtained.

Some functions may contain conditional branch statements and loop control statements at the same time. A processing unit mapped to such a function may depend on the details of the conditional branch statements and loop control statements contained. For example, in case a function contains five conditional branch statements and one of the conditional branch statements has a single nesting stage, a preferable processing unit is DSP. In case the same function also contains four loop control statements, the corresponding preferable processing unit is CPU.

In this embodiment, a weighting factor is given to each item of conditions for assigning a processing unit (FIG. 28) and the processing unit which has scored the highest mark is selected as an optimum processing unit.

FIG. 29 is a schematic view of a conceptual chart of the relationship between the items of conditions for assigning processing units and a weighting factor. This information is also included in the library 2332. How to determine the processing unit for func_A is described below. K in FIG. 29 represents a weighting factor assigned to each item. As shown in FIG. 29, encircled items in FIG. 29 apply for func_A. Adding the weighting factor for the items which apply, the resulting weighting factor value for CPU is calculated as follows: 1+2=3 for the number of nestings of conditional branch statements, 1+3=4 for generation of variables, 1+1=2 for the number of nestings of loop control statements, 1+1=2 for generation of variables for the number of repetitions, thus 3+2+2+1=11. The resulting weighting factor value for DSP is calculated as follows: 6 for the number of conditional branch statements, 2+2=4 for the number of nestings of conditional branch statements, 2+2=4 for generation of variables, 1+2+3=6 for generation of variables for the number of repetitions of loop control statements, thus 6+4+4+6=20. The resulting weighting factor value for the dedicated logic is calculated as follows: 1 for the number of nestings of conditional branch statements, 6 for the number of loop control statements, 2 for the number of nettings, 2 for generation of variables for the number of repetitions, thus 1+1+6+2+2=12.

Comparing the factor per processing reveals CPU=11, DSP=20 and the dedicated logic=11. DSP is thus determined to be an optimum processing unit. It is possible to map other functions to processing units. FIG. 30 is a schematic view of a conceptual chart of a mapping result example.

In this way, an appropriate processing unit is mapped to each function used in the program 132. The mapping results information 2342 is stored into the auxiliary memory 140.

As mentioned above, by mapping an appropriate processing unit to each function contained in the program 132 based on the detailed use form of conditional branch statements and loop control statements, it is possible to obtain appropriate design support information related to the system ISI design.

In the foregoing embodiments, the information in the library 2332 to be stored into the auxiliary memory 130 is not limited to the values shown in FIGS. 24, 26 and 28 but may be arbitrarily specified by the designer. The values may be updated.

While in the foregoing embodiments, an if statement in the C language is used as a conditional branch statement, another conditional branch statement such as a switch statement may be used. Similarly, while an if statement in the C language is used as a loop control statement, another loop control statement such as a while statement may be used.

While in the foregoing embodiments, the auxiliary memories 130 and 140 are arranged externally to the computer 100, they maybe arranged inside the computer 100. The library 2332 may be stored separately as a database from among the information to be stored into the auxiliary memory 130 and connected via a telecommunications line to allow access to the information in the library 2332 from a plurality of computers.

A program describing the features of the system LSI design support apparatus is not limited to the examples of the foregoing embodiments.

As mentioned hereinabove, according to the invention, by counting and summing the number of conditional branch statements and the number of loop control statements per function contained in a program which describes part or whole of the system features in a high-level language, it is possible to obtain appropriate design support information used to adequately assign the system features to the processing units incorporated in a system LSI.

Although the present invention has been fully described by way of examples with reference to accompanying drawings it is noted that various changes and modifications will be apparent to those skilled in the art. For example, although calculation section in the embodiment simply sum up the counting result, it is noted that calculation section of the present invention may perform conditionally sum up the counting result or perform other calculations in order to acquire the calculation result. Therefore, unless such changes and modifications depart from the scope of the claims, they should be constructed as being included therein.

What is claimed is:

1. System LSI design support apparatus which supports a design for assigning system features to a system LSI comprising processing units having a plurality of different architectures, said apparatus having as an input a program describing system features in a high-level language, comprising:
   a function extractor, which extracts functions described in the program;
   an analyzer, which counts the number of conditional branch statements and the number of nestings of the conditional branch statements described in each function extracted by the function extractor; and
   a calculation section, which outputs calculation result information based on the counting results of the analyzer for each function extracted by the function extractor.

2. The system LSI design support apparatus according to claim 1, wherein, based on the calculation process of variables related to the conditions of the conditional branch statements described in each function extracted by the function extractor, the analyzer counts the number of functions required to generate the variables.

3. The system LSI design support apparatus according to claim 1, further comprising:
   mapping means, which compares definition information where a plurality of combinations selected out of the number of conditional branch statements processed by the processing unit, the number of nestings of the conditional branch statements and the number of functions required to generate variables related to the conditions of the conditional branch statements are defined per separate processing unit, with calculation result information output from the calculation section to map an appropriate processing unit to each function.

4. The system LSI design support apparatus according to claim 1, wherein the function extractor comprises:
   function combination means, which specifies at least one of the plurality of sets of functions arbitrarily selected from the functions extracted by the function extractor and that the analyzer performs analysis of each set of functions specified by the function combination means.

5. System LSI design support apparatus which supports a design for assigning system features to a system LSI comprising processing units having a plurality of different architectures, said apparatus having as an input a program describing system features in a high-level language, comprising:
   a function extractor, which extracts functions described in the program;
   an analyzer, which counts the number of loop control statements described in each function extracted by the function extractor; and
   a calculation section, which outputs calculation result information based on the counting results of the analyzer for each function extracted by the function extractor.

6. The system LSI design support apparatus according to claim 5, wherein the analyzer counts the number of nestings of the loop control statements described in each function extracted by the function extractor.

7. The system LSI design support apparatus according to claim 5, wherein, based on the calculation process of variables related to the number of repetitions of loop control statements described in each function extracted by the function extractor, the analyzer counts the number of functions required to generate the variables.

8. The system LSI design support apparatus according to claim 5, further comprising:
   mapping means, which compares definition information where a plurality of combinations selected out of the number of loop control statements processed by the processing unit, the number of nestings of the loop control statements and the number of functions required to generate variables related to the number of repetitions of the loop control statements are defined per separate processing unit, with calculation result information output from the calculation section to map an appropriate processing unit to each function.

9. System LSI design support apparatus which supports a design for assigning system features to a system LSI comprising processing units having a plurality of different architectures, said apparatus having as an input a program describing system features in a high-level language, comprising:
   a function extractor, which extracts functions described in the program;
   an analyzer, which counts the number of conditional branch statements and loop control statements described in each function extracted by the function extractor; and
   a calculation section, which outputs calculation result information where the counting results of the analyzer are summed for each function extracted by the function extractor.

10. The system LSI design support apparatus according to claim 9, wherein the analyzer counts the number of nestings of the conditional branch statements and loop control statements described in each function extracted by the function extractor.

11. The system LSI design support apparatus according to claim 9, wherein, based on the calculation process of variables related to the number of repetitions of the conditional branch statements and loop control statements described in each function extracted by the function extractor, the analyzer counts the number of functions required to generate the variables.

12. The system LSI design support apparatus according to claim 9, further comprising:
mapping means, which compares definition information where a plurality of combinations selected out of the number of conditional branch statements and loop control statements processed by the processing unit, the number of nestings of the conditional branch statements and loop control statements, and the number of functions required to generate variables related to the number of repetitions of the conditional branch statements and loop control statements are defined per separate processing unit, with calculation result information output from the calculation section to map an appropriate processing unit to each function.

13. A system LSI design support method which supports a design for assigning system features to a system LSI comprising processing units having a plurality of different architectures, comprising steps of:
inputting a program describing system features in a high-level language;
extracting functions described in the program;
counting the number of conditional branch statements described in each function extracted;
counting the number of nestings of the conditional branch statements described in each function extracted; and
outputting calculation result information based on the counting results for each function extracted.

14. The system LSI design support method according to claim 13, further comprising the step of:
counting, based on the calculation process of variables related to the conditions of the conditional branch statements described in the each function extracted, the number of functions required to generate the variables.

15. The system LSI design support method according to claim 13, further comprising the steps of:
inputting definition information where a plurality of combinations selected out of the number of conditional branch statements processed by the processing unit, the number of nestings of the conditional branch statements and the number of functions required to generate variables related to the conditions of the conditional branch statements are defined per separate processing unit; and
comparing the definition information with the calculation result information to map an appropriate processing unit to each function.

16. The system LSI design support method according to claim 13, further comprising the step of:
specifying at least one of the plurality of sets of functions arbitrarily selected from the functions extracted,
wherein the specifying step performs the calculation of each of the specified sets of functions.

17. A system LSI design support method which supports a design for assigning system features to a system LSI comprising processing units having a plurality of different architectures, comprising steps of:
inputting a program describing system features in a high-level language;
extracting functions described in the program;
counting the number of loop control statements described in each function extracted; and
outputting calculation result information based on the counting results which are summed for each function extracted.

18. The system LSI design support method according to claim 17, further comprising the step of:
counting the number of nestings of the loop control statements described in the each function extracted.

19. The system LSI design support method according to claim 17, further comprising the step of:
counting, based on the calculation process of variables related to the number of repetitions of the loop control statements described in the each function extracted, the number of functions required to generate the variables.

20. The system LSI design support method according to claim 17, further comprising the steps of:
inputting definition information where a plurality of combinations selected out of the number of loop control statements processed by the processing unit, the number of nestings of the loop control statements and the number of functions required to generate variables related to the number of repetitions of the loop control statements are defined per separate processing unit; and
comparing the definition information with the calculation result information to map an appropriate processing unit to each function.

21. A system LSI design support method which supports a design for assigning system features to a system LSI comprising processing units having a plurality of different architectures, comprising steps of:
inputting a program describing system features in a high-level language;
extracting functions described in the program;
counting the number of conditional branch statements and loop control statements described in each function extracted; and
outputting calculation result information where the counting results for each function are extracted.

22. The system LSI design support method according to claim 21, further comprising the step of:
counting the number of nestings of the conditional branch statements and loop control statements described in the each function extracted.

23. The system LSI design support method according to claim 21, further comprising the step of:
counting, based on the calculation process of variables related to the conditions of the conditional branch statements and those related to the number of repetitions of the loop control statements described in the each function extracted, the number of functions required to generate said variables.

24. The system LSI design support method according to claim 21, further comprising the steps of:
inputting definition information where a plurality of combinations selected out of the number of conditional branch statements and loop control statements processed by the processing unit, the number of nestings of the conditional branch statements and loop control statements, and the number of functions required to generate variables related to the conditions of the conditional branch statements and those related to the number of repetitions of the loop control statements are defined per separate processing unit; and
comparing the definition information with the calculation result information to map an appropriate processing unit to each function.

25. Database apparatus for storing data to be provided to system LSI design support apparatus which supports a design for assigning system features to a system LSI comprising processing units having a plurality of different architectures, wherein the data concerns a program describing system features in a high-level language and the data is definition information where the number of conditional branch statements and the number of nestings of the conditional branch statements processed by the processing unit is defined per separate processing unit.

26. Database apparatus for storing data to be provided to system LSI design support apparatus which supports a design for assigning system features to a system LSI comprising processing units having a plurality of different architectures, wherein the data concerns a program describing system features in a high-level language and the data is definition information where the number of loop control statements processed by the processing unit is defined per separate processing unit.

27. Database apparatus for storing data to be provided to system LSI design support apparatus which supports a design for assigning system features to a system LSI comprising processing units having a plurality of different architectures, wherein the data concerns a program describing system features in a high-level language and that said data is definition information where the number of conditional branch statements and loop control statements processed by the processing unit is defined per separate processing unit.

* * * * *